United States Patent [19]

Isobe

[11] 4,360,929
[45] Nov. 23, 1982

[54] AUTOMATIC GAIN CONTROL CIRCUIT
[75] Inventor: Mitsuo Isobe, Moriguchi, Japan
[73] Assignee: Matsushita Electric Industrial Co., Ltd., Kadoma, Japan
[21] Appl. No.: 160,325
[22] Filed: Jun. 17, 1980
[30] Foreign Application Priority Data Jun. 22, 1979 [JP] Japan .................................. 54-79433
Aug. 20, 1979 [JP] Japan ............................. 54-106304
Sep. 3, 1979 [JP] Japan .............................. 54-112573

[51] Int. Cl.³ ............................................. H04N 5/52
[52] U.S. Cl. .................................... 455/245; 455/251;
375/98; 358/177; 328/149
[58] Field of Search ................ 328/165, 149; 330/132;
375/98; 455/245, 239, 240, 251; 358/177, 174

[56] References Cited
U.S. PATENT DOCUMENTS

| | | | |
|---|---|---|---|
| 2,937,270 | 5/1960 | Atwood | 375/98 |
| 3,676,792 | 7/1972 | Newton | 330/132 X |
| 3,838,350 | 9/1974 | Ewanus et al. | 375/98 X |
| 4,013,964 | 3/1977 | Skuta | 455/245 |
| 4,212,032 | 7/1980 | Harford | 358/177 |

Primary Examiner—John S. Heyman
Attorney, Agent, or Firm—Amster, Rothstein & Engelberg

[57] ABSTRACT

An AGC circuit includes an amplitude synchronous detector using a phase-locked loop (PLL), a variable gain amplifier for supplying a signal to this detector, and a means for controlling the amplification degree of the amplifier to make the output signal level constant. More specifically, the AGC circuit includes a first AGC loop including an AGC detector and a low-pass filter provided before the AGC detector, a second AGC loop including a synchronous detector and a phase synchronized state detecting circuit DC coupled to the output end of the synchronous detector, the output signal from the phase synchronized state detecting circuit being used to control the AGC circuit, and a noise eliminating circuit provided at the final stage for adding the output signal from the phase synchronized state detecting circuit and the output signal from the synchronous detector, or for performing subtraction between both the signals.

19 Claims, 8 Drawing Figures

F I G. 7
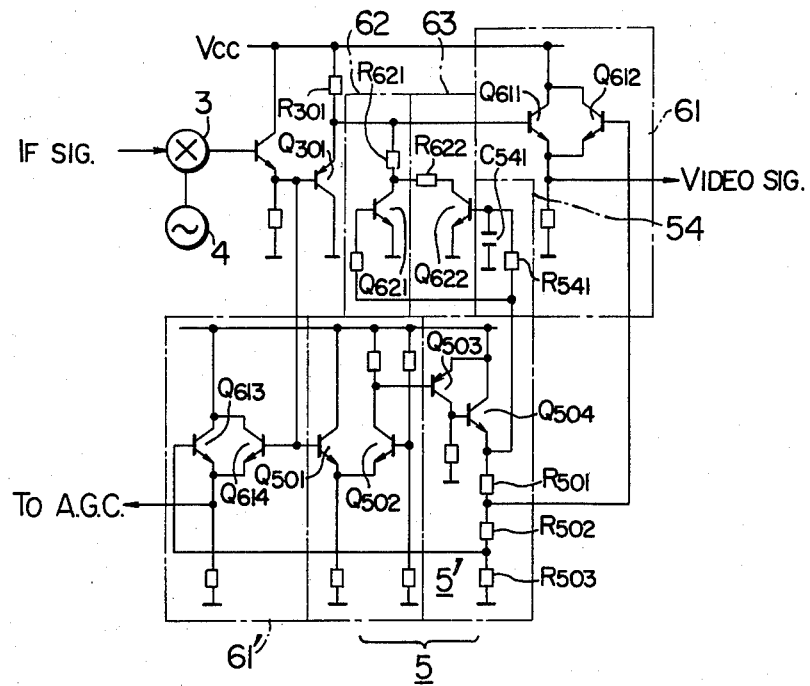
F I G. 8
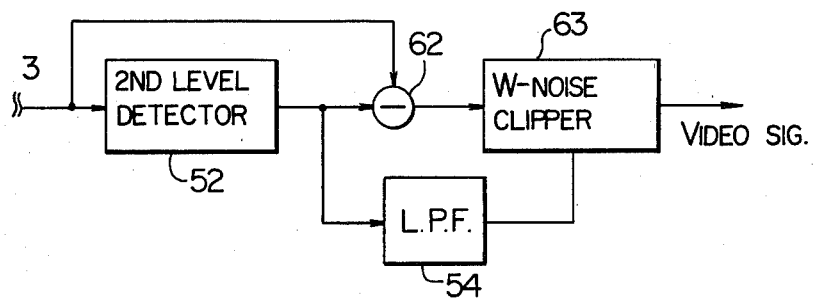

AUTOMATIC GAIN CONTROL CIRCUIT

The present invention generally relates to receivers for amplitude-modulated radio frequency signals, and particularly to an automatic gain control (AGC) circuit for receivers having an amplitude synchronous detector with the aid of a phase synchronizing loop (or phase-locked loop) and an arrangement of a processing circuit for the output signal from the synchronous detector.

For convenience of describing the invention, a television receiver will be given as an example.

The television receiver generally includes a tuner for converting an incoming radio frequency signal into a predetermined intermediate frequency (IF) signal, an IF signal processing circuit for amplifying and detecting the IF signal, and an AGC circuit for controlling amplitude of a video detected output signal to be substantially constant. In a video detector using a quasi-synchronous detection method in which a carrier wave component of a video IF signal is extracted from the output signal which is produced by envelope detection or from the tuner, the detected output signal is substantially equal to the envelope waveform of an input signal to the video detector. Thus, even though oscillation frequency of a local oscillator in the tuner is slightly different from a predetermined value, a low frequency component of a video signal can be obtained in the output signal from the video detector. The AGC circuit is formed of a video low-pass filter for removing a high frequency component from the output signal of the video detector, an AGC detector, and an AGC filter for producing an AGC voltage of DC. The output of the AGC circuit is used to control gain of a video IF amplifier thereby to maintain the signal level at the input to or output from the video detector substantially constant. The video low-pass filter in the AGC circuit functions to prevent thermal noise produced upon reception of a weak signal from causing the AGC circuit to operate erroneously, and also, in the television receiver, the video low-pass filter functions to prevent the AGC circuit from operating erroneously by an intercarrier audio signal produced at the output end of the video detector. When a phase-locked loop (PLL) type video synchronous detector (hereinafter referred to as PLL detector) with which an ideal video IF detector is realized is combined with the AGC circuit of the above construction, a big problem arises in practical use. In the PLL detector, when the PLL is in an asynchronous state, a beat signal occuring at the output end of the PLL detector is attenuated by the video low-pass filter, and thus the AGC circuit operates to increase the gain of the video IF amplifier; the higher the beat signal frequency, the more the gain increases. This results in the fact that a phase comparator, the PLL detector and the video IF amplifier in the PLL operate with an excessive signal level and thus, are brought into an unstable region. To solve the problem, there has been proposed a method in which, for example, the video low-pass filter is provided with a wide band characteristic in accordance with the frequency change of the beat signal. This method, however, deteriorates the performance of the AGC circuit.

Accordingly, it is an object of the invention to provide an AGC circuit capable of preventing input signal level to or output signal level of a PLL detector from excessively increasing in the asynchronous state of the PLL, thereby maintaining a video IF circuit in a stable operating region.

In the invention, the noise characteristic of the video IF circuit is improved, and particularly, an AGC circuit is prevented from erroneously operating by an external pulse noise.

Further in the invention, the AGC circuit is capable of successfully removing a noise component of a video detector output signal into which a pulse noise is mixed.

Further, the video IF circuit is constructed to be suitable for being formed as a known integrated circuit.

Thus, in the video IF circuit a video IF detector is constructed to multiply a video IF carrier signal reproduced by using a conventional carrier phase-locked loop method, a video IF signal into which a video RF signal is frequency-converted by a tuner and which is supplied through a certain video IF amplifier. The video IF amplifier and a high-frequency amplifier in the tuner are controlled in amplification degree by a conventional delay AGC system in accordance with the DC output voltage from the AGC circuit to which the output of the video IF detector is applied. For the object of the invention, the AGC circuit is constructed to have a video low-pass filter, an AGC detector and an AGC low-pass filter connected in series and to produce a DC output voltage in response to amplitude of an input video signal. In addition, the AGC circuit is DC-coupled to the output terminal of the video IF detector and constructed in the form of a double loop which is also controlled by an output of a PLL-synchronized-state detecting means which provides a signal detection polarity substantially different from the detection polarity of the video IF detector. Furthermore, a pulse noise component which is mixed into an incoming signal and exists within a video IF band, is converted into a base band noise by the video IF detector and superimposed upon a video detected output signal, but this noise is eliminated by a certain signal output of the PLL-synchronized-state detecting means.

According to the present invention with such fundamental construction, the input to or output of the detector can be maintained to be substantially constant irrespective of any beat signal frequency even though the PLL is in the asynchronous state. Therefore, all the circuits can be maintained in a stable operation region. A noise eliminating circuit provided according to the invention has an advantage of causing no lockout phenomenon.

The invention will best be understood from the following description of embodiments thereof, given by way of example, in conjunction with the accompanying drawing, in which:

FIG. 7 is a specific embodiment of a video IF circuit according to the invention; and FIG. 8 is a block diagram of a video signal noise eliminating circuit according to the present invention.

Figure 1:
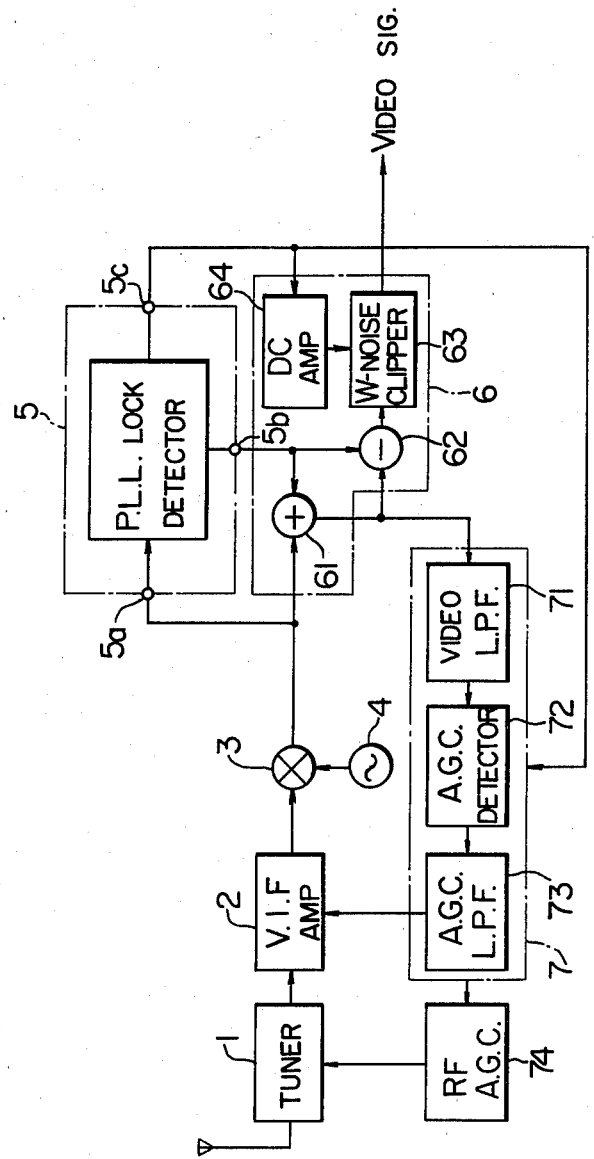
FIG. 1 is a block diagram of an example of the tuner, video IF circuit of a television receiver in which the invention is used.
Figure 4:
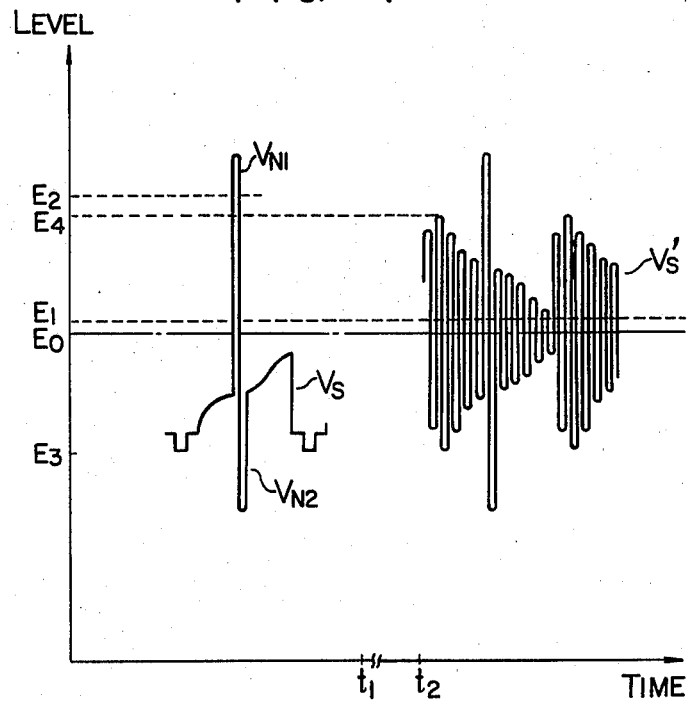
FIG. 4 is a waveform diagram useful for explaining the operations of the systems in FIGS. 2 and 3.

FIG. 1 shows an embodiment of a tuner and a video IF circuit of a televison receiver including an AGC circuit according to the invention. An incoming radio frequency signal is converted into a predetermined video IF signal by a tuner 1. This video IF signal includes an amplitude-modulated composite video signal component consisting of a luminance information, a chromaticity information and a synchronizing information for synchronization of a scanning circuit, and a frequency-modulated audio signal component. This video IF signal is applied through a certain frequency selecting circuit to a variable-gain type video IF amplifier 2. A video IF detector 3 is formed of a multiplier which is supplied with a carrier component from a carrier generator 4 which reproduces a carrier component of the video IF signal and with a video IF signal from the video IF amplifier 2 so as to synchronously detect the video IF signal. The carrier generator 4 includes at least an oscillator which is controlled by for example a PLL (phase-locked loop) to generate a signal of known frequency and phase. The output signal from the generator 4 is phase-adjusted to have zero or $\pi$ (radians) relative to the carrier wave of the video IF signal by a proper phase shifter provided at the generator 4. The video IF detector 3 produces a video signal if the PLL is in the synchronous state. Since a pulse noise component mixed into the incoming input signal is not in a certain phase relation with the output signal from the carrier generator 4, the frequency of the noise is converted into a base band by the video IF detector 3. Thus, the video signal has noise superimposed thereon over a definite white peak level unlike that in a conventional detector (an envelope detector or the like). The video IF detector 3, if the PLL is in the acynchronous state, functions in the same way as a frequency converter in a conventional tuner, and generates at its output end a difference signal between the video IF signal and the output signal from the carrier generator 4. The output signal from the video IF detector 3 is applied to a phase-synchronized-state detector circuit 5 provided in this invention, and also to a video signal processing circuit 6. An input terminal 5a of the phase-synchronized-state detector circuit 5 is DC-coupled to the output terminal of the video IF detector 3. At output terminals 5b and 5c of the phase-synchronized-state detector circuit 5 are produced different detected output signals. The signals at the output terminals 5b and 5c are produced from an amplitude information detector which is responsive to an amplitude information above or below a certain DC level, preferably, exceeding the white peak level of the video signal, to provide a desired detection margin. Thus, when the video signal is normally reproduced by the video IF detector, there are produced no detected signals from the terminals 5b and 5c of the phase-synchronized-state detector circuit 5. When the detected video signal is superimposed thereon with white noise which has a level exceeding white peak level and thus causes the above amplitude information detector to produce a response, there is produced at the output terminal 5b a pulse signal of substantially an envelope wave shape of the noise components, and at the output terminal 5c a DC signal resulting from smoothing the signal produced at the terminal 5b. Although these circuits, or the amplitude information detector and the smoothing circuit are practically connected in series, the arrangement may be varied if necessary. In particular, as far as the video signal is normally reproduced, it is very useful to eliminate any response to the pulse noise in the invention from the practical point of view. For example, as shown in the phase-synchronized-state detecting circuit 5 of FIG. 2, first and second amplitude information detectors 51 and 52 connected to the input terminal 5a supply their outputs to a subtracter 53, the subtracted output from which is supplied to a low-pass filter 54 whose output appears at the terminal 5c. In addition, the terminal 5b is connected to the output terminal of the second amplitude information detector 52. The detector 52 is set at a detection level so as to respond to both noise component exceeding the white peak level and a beat signal produced in the asynchronous state of the PLL. The detector 51 is set at a detection level providing a larger detection margin than the detection level of the detector 52 so as to respond to only the white noise. In order to make clear the operation of the phase-synchronized-state detecting circuit 5 of FIG. 2, it is assumed that the dynamic range of the video IF detector 3 at its output terminal is sufficiently wide, and the frequency of the beat signal occuring in the asynchronous state of the PLL is low enough. Under these conditions, since the output signal from the video IF detector 3 is controlled for the peak level on the synchronizing signal to be constant by a peaktype AGC (automatic gain control) widely used for an AGC circuit of a negative modulation television receiver, the peak level on the synchronizing signal of the video signal or beat signal is always made constant. Therefore, in the asynchronous condition of the PLL, the beat signal oscillates to the positive and negative sides in a sine wave with respect to the zero carrier level. In other words, as shown in FIG. 4, if the peak level of the synchronizing signal of the video signal is represented by $E_3$, the peak level on one side of the beat signal is also controlled by $E_3$. Thus, the peak level $E_4$ on the other side of the beat signal and the zero carrier level $E_0$ always have the relation given by $$E_0 - E_3 = E_4 - E_0$$

Figure 2:
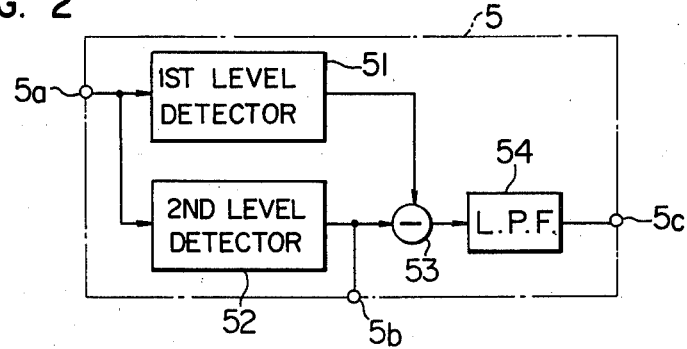
FIG. 2 is a block diagram of a signal processing system for a PLL-synchronized-state detecting means provided according to the invention.

If the detection levels of the detectors 52 and 51 as described above are represented by $E_1$ and $E_2$, respectively, since the detector 51 does not respond to the beat signal, a DC signal is also produced at the output terminal 5c in response to the beat signal by taking the difference between the outputs of the detectors 51 and 52 as shown in FIG. 2. If a pulse noise is mixed in an incoming input signal, particularly a noise exceeding the detection level $E_2$ of the detector 51 is detected by both the detectors 51 and 52. Such noise occurs normally when the incoming input signal level is small as well known, but by taking the arrangement of the invention as shown in FIG. 2, the noise is prevented from appearing at the output terminal 5c. In short, in FIG. 2, a DC signal is produced at the output terminal 5c in responce to only the beat signal and at the output terminal 5b there can be produced a pulse signal in response to both the beat signal and noise component.

Figure 3:
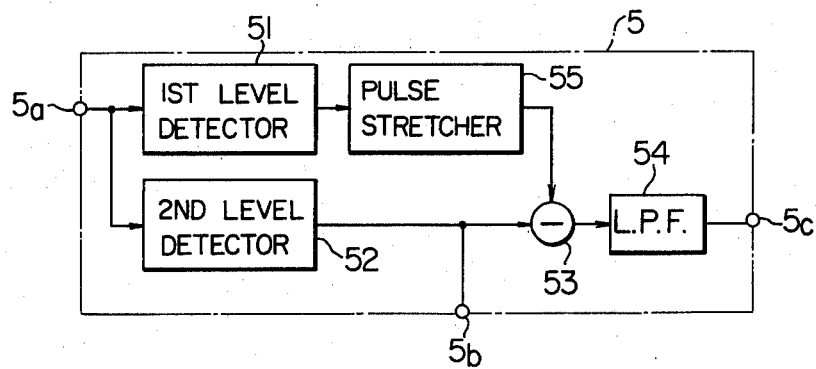
FIG. 3 is a block diagram of a signal processing system for a more improved synchronized-state detecting means.

FIG. 3 is a block diagram of a signal processor as a further improved phase-synchronized-state detecting circuit 5. As shown, a pulse stretcher circuit 55 for extension of a pulse width is provided at the output of the first amplitude detector 51. This arrangement is signal from the detector circuit is produced between the synchronizing signal and zero carrier levels. Normally the DC level difference is small, and thus the detection of such noise is very difficult if considering a necessary margin for noise detection. Thus it is obvious that in the positive modulation receiver any noise in the white and black directions can not be processed properly by the amplitude separation type noise detector circuit.

On the other hand, when the detector circuit is of synchronous detection type, the noise on the synchronizing signal is considerably increased as compared with the envelope detection type, enough to be detected by an amplitude separator type noise detector. Accordingly, it is possible to eliminate the black noise in the detected output signal, or noise on the synchronizing signal. However, as is evident from the above description of the positive modulation receiver, noise in the white direction still remains, results in the cause of the following drawbacks. For example, as the effect on the scanning circuit, the remaining white noise changes the average DC level of the signal to the synchronizing separator circuit, the input to which is normally AC-coupled, so that the output signal may contain part of the picture signal as well as the synchronizing signal introduced therein. The white noise also badly affects the quality of the reproduced picture to a great extent.

The arrangement of the present invention does not require the change of the construction for the negative modulation receiver upon the application to the positive modulation receiver, and has only different functions of the circuits provided. In this case, the phase-synchronized-state detecting circuit 5 as shown in FIG. 1 is, in effect, operated as a black noise detecting circuit not as a white noise detector. The adder circuit (the subtracter circuit in this case) for noise elimination in the signal to the AGC circuit 7 is able to eliminate noise in effect, if the AGC circuit is of the average-value type. Thus, the advantage obtained in the application of the invention to the positive modulation receiver mainly resides in the elimination of white and black noises of the detected output signal.

Since the average DC level of the signal to the synchronizing signal separator circuit is not changed by noise, the synchronizing signal of the output separated can be prevented from including picture information. The conventional arrangement sometimes provides a relatively wide quasi-synchronizing signal by noise, whereas in this embodiment the width of the signal can be remarkably reduced, thereby improving the stability of the synchronizing operation of the scanning circuit. The quality of the reproduced picture is remarkably improved by elimination of white noise in the luminance information. In the conventional receiver, if white noise larger than white occurs, noise contrast is not only considerably increased but the picture tube tends to produce a grid current, resulting in creation of much adverse effect on practical use of receiver, whereas in this invention the noise is reduced to a definite level, namely eliminated. In addition, black noise in the signal used as luminance information can be reduced to a predetermined level. In this case, for the separation of synchronizing information as described previously, a common subtracter for noise elimination or individual subtracters should be used considering necessary elimination levels for both purposes.

FIG. 7 shows a specific embodiment of part of the invention. A differential level comparator including transistors Q501 and Q502 is a phase synchronized state detector. This level comparator and the waveform shaping circuit 5′ formed by a pulse stretcher PNP transistor Q503 and an output buffer transistor Q504, constitute the second amplitude information detector 52 as shown in FIGS. 2 and 3. This wave shaping circuit 5′ is connected at its output to resistors R501, R502 and R503 for three different-level white noises. The two noise outputs of three are respectively applied to the black noise eliminating subtracter circuit 61 for the detected output signal which is formed by transistors Q611 and Q612, and a processing circuit 61′ for AGC circuit which is formed by transistors Q613 and Q614. The white noise eliminating circuit, that is, the first switching circuit of transistors Q621 and Q301 and the second switching circuit of transistors Q622 are both driven by the other noise output or noise from the emitter of the transistor Q504. In this arrangement, the output level of the noise detecting circuit is prevented from changing even though the transistors of the switching circuits are conducted into saturation. The first switching circuit functions to be instantly responsive to the output of the phase-synchronized-state detecting circuit 5 to fix the noise level of the output of the transistor Q301 at a desired level which is determined by resistors R301 and R621 and the saturation voltage of the transistor Q621. The transistor Q622 of the second switching circuit is supplied with the output of the phase-synchronized-state detecting circuit 5 through a resistor R541 and a capacitor C541, which constitute the smoothing circuit 54, thereby maintained in the conducting state during occurence of noise in the white direction. Then, the transistor Q301 is turned off, clipping all the noises exceeding a level which is determined by the resistors R301, R621 and R622 and the saturation voltage of the transistor Q622. The white noise elimination and clipping levels obtained by the first and second switching circuits are normally different from each other. This is based only on the fact that the instantaneous level of the detected output signal which is fixed by the white noise elimination operation is brought within the amplitude of the luminance information to thereby reduce contrast of noise. Thus, the present invention is not limited to the specific construction of FIG. 7. In other words, the other end of the resistor R622 connected to the transistor Q622 constituting the second switching circuit may be connected to the emitter terminal of the transistor Q301. The clipping operation of the second switching circuit provided according to the invention is different in essence from the cutoff action of the known Zener diode or the base-emitter junction of transistor. The Zener diode has a constant clipping level and thus does not follow the variation of power supply voltage for this kind of circuit, while the base-emitter junction of transistor has a drawback of producing distortion in part of picture information in which the luminance level is relatively high irrespective of presence or absence of noise because bias current is decreased. According to the invention, the clipping level follows the change of source voltage and distortion does not occur when normal noise is not produced. Since the clipping circuit has the feature of operating only upon noise occurence, the second switching circuit construction has no limit.

The AGC circuit of the invention has not only the various advantageous performances but a novel noise eliminating function suitable for being formed as an integrated circuit, as described above. Moreover, particularly the invention does not require the lockout prevention circuit for AGC circuit, and in this inveneffective to considerably reduce a residual component of noise occuring due to the different detection levels of the first and second detectors 51 and 52.

Figure 5:
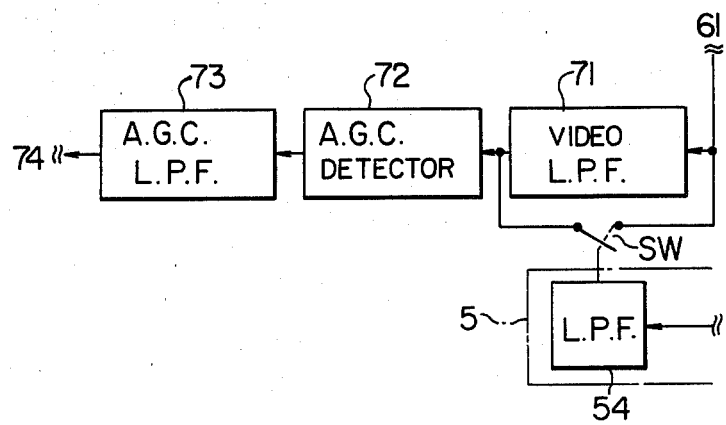
FIG. 5 is a block diagram of an embodiment of a double loop AGC circuit according to the invention.

The video signal processing circuit 6 as shown in FIG. 1 comprises an adder 61 for adding the output signal from the video IF detector 3 and the output signal at the pulse signal output terminal 5b of the phase-synchronized-state detecting circuit 5, a subtractor 62 for subtraction between the outputs from the adder 61 and from the terminal 5b, a white noise clipper 63 for removing an undesired signal component from the output signal which is produced from the subtractor 62, and a DC amplifier 64 which is supplied with the signal from the output terminal 5c of the phase-synchronized-state detecting circuit 5 and produces an amplified output signal by which the white noise clipper 63 is controlled. The adder 61 in this arrangement according to the invention functions to eliminate a black noise in the video signal, or the noise component on the synchronizing signal by use of a pulse-shape signal produced at the output terminal 5b of the phase-synchronized-state detecting circuit 5, and thus this black noise elimination way by this adder 61 is different from that by a conventional apparatus. In the conventional apparatus, a detector circuit for detecting the black noise in the video signal is provided to produce an output by which the black noise in the video signal is eliminated, while in this invention the elimination of the black noise in the video signal is performed by use of the white noise output produced at the output terminal 5b. The subtracter 62 is operated under the same principle as a conventional white noise elimination method. The white noise clipper 63 is characterized in that in this invention it operates only upon occurence of noise and in the asynchronous state of PLL. Thus, the output level of such circuit can be made substantially constant independent of the beat signal and normal video signal, enabling the prevention of overdrive of the succeeding stage, particularly a picture tube or the like. The video signal from which the black noise is eliminated by the adder 61 is applied to an AGC circuit 7. The AGC circuit 7 includes a known video signal low-pass filter 71, an AGC detector 72 and an AGC low-pass filter 73, and produces at its output a DC voltage for controlling the amplification degree of the video IF amplifier 2 and the high-frequency amplifier in the tuner 1. In the embodiment of the invention, a RF AGC setting circuit 74 is provided to control the tuner 1 and the video IF amplifier 2 by the method of delay AGC as in most receivers. The AGC circuit 7 in the arrangement of the invention is controlled to be of wide band by the output of the phase-synchronized-state detecting circuit 5. Particularly, the arrangements of the invention as shown in FIGS. 2 and 3 in which noise effect is removed, are suitable for controlling the AGC circuit only when the PLL is in the asynchronous state. For example, as shown in FIG. 5, a short circuiting switch SW is connected between the input and output ends of the video signal low-pass filter 71 and closed by use of the output signal from the phase-synchronized-state detecting circuit 5. Thus, when the PLL is in the asynchronous state, the AGC circuit 7 functions as a wide band AGC circuit, and therefore the level of the input signal to or the output signal of the video IF detector 3 can be maintained substantially constant as long as the beat signal frequency is in a range of several MHz. For such control operation, it is effective that the low-pass filter 54 in the phase-synchronized-state detecting circuit 5 is formed as a peak value or quasi-peak value type rectifying circuit.

Figure 6:
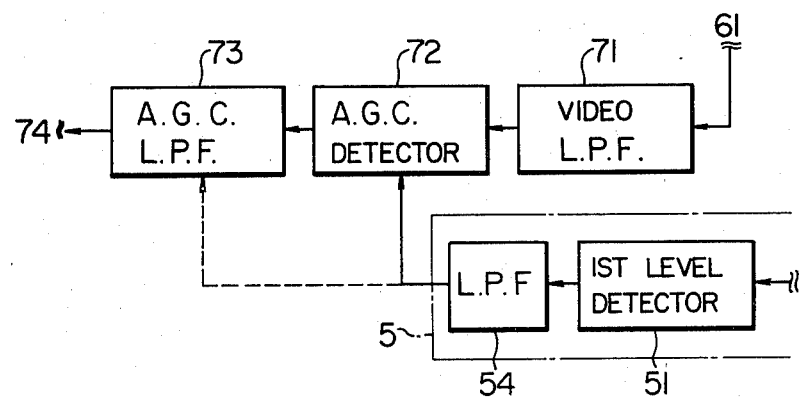
FIG. 6 is a block diagram of another embodiment of a double loop AGC circuit according to the invention.

FIG. 6 shows an arrangement for controlling the AGC detector 72, in which a known AGC reference voltage is controlled by the phase-synchronized-state detecting circuit 5. If the low-pass filter 54 is an average-value type rectifying circuit, the output thereof correctly corresponds to the excess of a predetermined beat amplitude and in this case the first detector 51 as described above is employed for the amplitude information detector. Thus, by controlling the reference voltage of the AGC detector 72 to decrease the amplitude of the beat signal, it is possible to maintain substantially constant the input level to or output signal level from the video IF amplifier 2 irrespective of the frequency of beat signal, and thereby always keep the operation of the video IF circuit in the stable condition. In addition, it is possible to control the AGC filter 73 as shown in FIG. 6 by a broken line. In addition to the control of a single AGC circuit, a plurality of AGC circuits can be used in parallel.

The arrangement of the signal processing circuit according to the invention has novel advantages different from those of a conventional apparatus. As described above, since white noise is used for elimination of black noise, the AGC circuit will not respond at all to an abrupt change of incoming input signal and thus even though the video detection output level is increased instantly, the noise detecting circuit of the invention does not respond to that change at all. Therefore, the AGC circuit 7 is able to maintain its negative feedback operation for keeping constant the peak level of the synchronizing signal of the video signal. In a conventional arrangement employing the black noise detection method, when the incoming input signal abruptly changes as described above, the black noise eliminating circuit initiates operation, eliminating the input video signal to the AGC circuit 7. Thus, it is necessary to provide a lockout prevention circuit because a lockout phenomenon occurs due to the positive feedback operation of the AGC circuit. The arrangement according to the invention has originally no occurence of such phenomenon and thus can be simplified in circuit.

Although the present invention has been described mainly for the application to the television receiver for negatively modulated signals, parts of the invention may be applied to the positive modulation receiver, as will be described below.

In a positive modulation receiver, a detected output signal has peak levels which are changed depending on picture information, so that the peak type AGC circuit as described in the negative modulation receiver is not desirable for the positive modulation receiver but an average-value type AGC circuit is employed therefor. The average-value type AGC circuit, as is well known, operates to keep the average DC level of the detected output signal constant, and thus the amplitude of the detected output signal can be changed about twice or more by the average luminance level (A.P.L.) of luminance information.

In such positive modulation receiver, particularly when the detector circuit is of the known envelope detection type, the amplitude separation type noise detector cannot be used for noise detection. On the other hand, an input signal to the synchronizing signal separator circuit which is an element for synchronizing the scanning circuit and the input signal, that is the peak level of noise on the synchronizing signal of the output tion the noise detecting circuit necessary for elimination of all the white noise and black noise is required to only detect white noise for negative modulation receiver, and only detect black noise for positive modulation receiver. The phase-synchronized-state detecting circuit provided in the circuit of the invention permits the circuit arrangement to be simplified, which is a very great advantage for the practical use.

FIG. 8 is a block diagram of a signal processing circuit which corresponds to the embodiment of this invention as shown in FIG. 7. The black noise processing circuits are provided separately for detected video signal and AGC circuit, and they may be a common one for both as shown in FIG. 1.

What is claimed is:

1. An automatic gain control (AGC) circuit comprising:

an amplitude synchronous detector for synchronously detecting an amplitude-modulated signal applied to the input terminal thereof and for producing a demodulated output signal from the output terminal thereof;

an AGC voltage generating circuit having an input terminal coupled to the output terminal of said amplitude synchronous detector, an output terminal coupled to the input terminal of the amplitude synchronous detector, and a control terminal, for maintaining the output signal level of the amplitude synchronous detector at a predetermined value in response to changes of input signal level to the amplitude synchronous detector, said AGC voltage generating circuit including a first low-pass filter coupled to the output terminal of the amplitude synchronous detector, an AGC detector coupled to the output terminal of said first low-pass filter and a second low-pass filter coupled to the output terminal of said ACG detector; and a phase-synchronized-state detecting circuit having an input terminal coupled to the output terminal of the amplitude synchronous detector, and an output terminal coupled to the control terminal of said AGC voltage generating circuit, for detecting an asynchronous state of the amplitude synchronous detector and for producing a control signal which is applied to the AGC voltage generating circuit in response to the detection of said asynchronous state to prevent a malfunction of the ACG voltage generating circuit.

2. The AGC circuit according to claim 1, wherein said phase-synchronized-state detecting circuit includes a beat detector coupled to the output terminal of said amplitude synchronous detector for detecting a beat signal which is produced from the amplitude synchronous detector when the detector is in an asynchronous state, and a third low-pass filter coupled to the output terminal of said beat detector for producing said control signal which is applied to the AGC voltage generating circuit, said control signal being used for increasing the signal pass band of said low-pass filter.

3. The AGC circuit according to claim 1, wherein said phase-synchronized-state detecting circuit includes a beat detector coupled to the output terminal of said amplitude synchronous detector for detecting a beat signal which is produced from the amplitude synchronous detector when the detector is in an asynchronous state, and a third low-pass filter coupled to the output terminal of said beat detector for producing said control signal which is applied to the AGC voltage generating circuit, said control signal being applied to said AGC detector for controlling the operation of the AGC detector so as maintain the output signal level of said amplitude synchronous detector at a predetermined level irrespective of the presence of the beat signal.

4. The AGC circuit according to claim 1, wherein said phase-synchronized-state detecting circuit includes a beat detector coupled to the output terminal of said amplitude synchronous detector for detecting a beat signal which is produced from the amplitude synchronous detector when the detector is in an asynchronous state, and a third low-pass filter coupled to the output terminal of said beat detector for producing said control signal which is applied to the AGC voltage generating circuit, said control signal being applied to said second low-pass filter for controlling the operation of the second low-pass filter so as to maintain the output signal level from said amplitude synchronous detector at a predetermined level irrespective of the presence of the beat signal.

5. The AGC circuit according to claim 1, wherein said phase-synchronized-state detecting circuit includes a first level detector for detecting noise, the level of which exceeds a level of a beat signal which is produced from the amplitude synchronous detector when the detector is in an asynchronous state, and a second level detector for detecting said beat signal.

6. The AGC circuit according to claim 5, wherein the input terminals of said first and second level detectors are coupled to the output terminal of said amplitude synchronous detector and produces output signals, and wherein the phase-synchronized-state detecting circuit includes a composing circuit, said output signals being coupled to said composing circuit wherein said output signals are added.

7. The AGC circuit according to claim 6 further including a pulse stretcher circuit having its input terminal coupled to the output terminal of said first level detector for extending the pulse width of the signal applied to the input terminal of said composing circuit.

8. The AGC circuit according to claim 1, wherein said phase-synchronized-state detecting circuit includes a noise detector for detecting noise in the output signal of said amplitude synchronous detector, and further comprising noise eliminating means having an input terminal coupled to the output terminals of said amplitude synchronous detector and said noise detector for substantially reducing noise by mixing the noise in the output signal of the amplitude synchronous detector with the detected noise from said noise detector.

9. The AGC circuit according to claim 8, wherein said noise eliminating means includes a first switching circuit which is directly responsive to the output signal of said noise detector of said phase-synchronized-state detecting circuit, a smoothing circuit for smoothing the output signal of the noise detector, and a second switching circuit which is responsive to the output signal of said smoothing circuit.

10. The AGC circuit according to claim 8, further comprising a waveform shaping circuit coupled to the output of the phase-synchronized-state detecting circuit which waveform shaping circuit has a certain characteristic for obtaining a pulse resulting from extending the substantially envelope waveform or width of the output signal of said phase-synchronized-state detecting circuit.

11. The AGC circuit according to claim 10, wherein the characteristic of said waveform shaping circuit is obtained by saturation operation of a transistor formed in an integrated circuit.

12. The AGC circuit according to claim 2, wherein said AGC voltage generating circuit includes switching means coupled between the input and output terminals of said first low-pass filter, said switching means being closed in response to said control signal from the third low-pass filter, to increase the signal pass band of the first low-pass filter.

13. An automatic gain control (AGC) circuit comprising:
an amplitude synchronous detector for synchronously detecting an amplitude-modulated signal applied to the input terminal thereof and for producing a demodulated output signal from the output terminal thereof;
an AGC voltage generating circuit having an input terminal coupled to the output terminal of said amplitude synchronous detector, an output terminal coupled to the input terminal of the amplitude synchronous detector, and a control terminal, for maintaining the output signal level of the amplitude synchronous detector at a predetermined value in response to changes of input signal level to the amplitude synchronous detector, and AGC voltage generating circuit including a first low-pass filter coupled to the output terminal of the amplitude synchronous detector, an AGC detector coupled to the output terminal of said first low-pass filter and a second low-pass filter coupled to the output terminal of said AGC detector; and
a phase-synchronized-state detecting circuit having an input terminal coupled to the output terminal of the amplitude synchronous detector, and an output terminal coupled to the control terminal of said AGC voltage generating circuit for detecting an asynchronous state of the amplitude synchronous detector and for producing a control signal to the AGC generating circuit in response to the detection of said asynchronous state, said phase-synchronized-state detecting circuit including a best detector coupled to the output terminal of said amplitude synchronous detector for detecting a beat signal which is produced from the amplitude synchronous detector when the detector is in the asynchronous state and for producing said control signal in response to the detection of the beat signal thereby preventing a malfunction of the AGC voltage generating circuit.

14. The AGC circuit according to claim 13, wherein said control signal is used for increasing the signal pass band of said first low-pass filter.

15. The AGC circuit according to claim 13, wherein said control signal is applied to said AGC detector for controlling the operation of the AGC detector so as to maintain the output signal level of said amplitude synchronous detector at a predetermined value irrespective of the presence of the beat signal.

16. The AGC circuit according to claim 13, wherein said control signal is applied to said second low-pass filter for controlling the operation of the second low-pass filter so as to maintain the output signal level of said amplitude synchronous detector at a predetermined value irrespective of the presence of the beat signal.

17. An automatic gain control (AGC) circuit comprising:
an amplitude synchronous detector for synchronously detecting an amplitude-modulated signal applied to the input terminal thereof and for producing a demodulated output signal from the output terminal thereof;
an AGC voltage generating circuit having an input terminal coupled to the output terminal of said amplitude synchronous detector, an output terminal coupled to the input terminal of the amplitude synchronous detector, and a control terminal, for maintaining the output signal level of the amplitude synchronous detector at a predetermined value in response to changes of input signal level to the amplitude synchronous detector;
a phase-synchronized-state detecting circuit having an input terminal coupled to the output terminal of the amplitude synchronous detector and first and second output terminals, said first output terminal being coupled to the control terminal of said AGC voltage generating circuit, said phase-synchronized-state detecting circuit detecting an asynchronous state of the amplitude-synchronous detector and producing a control signal to the AGC voltage generating circuit through said first output terminal in response to the detection of said asynchronous state, and for detecting a noise in the output signal of the amplitude synchronous detector and producing a noise detection signal through said second output terminal in response to the detection of noise; and
a noise eliminating circuit coupled to the output terminal of the amplitude synchronous detector and to the second output terminal of the phase-synchronized-state detecting circuit for mixing the output signal of the amplitude synchronous detector with said noise detection signal from the phase-synchronized-state detecting circuit so as to substantially reduce the noise,
whereby the output level of the amplitude synchronous detector is maintained at a predetermined level irrespective of the occurrence of the asynchronous state of the amplitude synchronous detector and the presence of noise in the output signal of the amplitude synchronous detector.

18. The AGC circuit according to claim 17, wherein said phase-synchronized-state detecting circuit includes a beat detector for detecting a beat signal which is produced from the amplitude synchronous detector when the detector is in an asynchronous state and for producing said control signal in response to the detection of the beat signal, and a noise detector for detecting a noise in the output signal of the amplitude synchronous detector and for producing said noise detection signal in response to the detection of noise.

19. An automatic gain control (AGC) circuit comprising:
an amplitude synchronous detector for synchronously detecting an amplitude-modulated signal applied to the input terminal thereof and for producing a demodulated output signal from the output terminal thereof;
an AGC voltage generating circuit having an input terminal coupled to the output terminal of said amplitude synchronous detector, an output terminal coupled to the input terminal of the amplitude synchronous detector, and a control terminal, for maintaining the output signal level of the amplitude synchronous detector at a predetermined value in response to changes of input signal level to the amplitude synchronous detector, and
a phase-synchronized-state detecting circuit having an input terminal coupled to the output terminal of the amplitude synchronous detector, and an output terminal coupled to the control terminal of said AGC voltage generating circuit for detecting an asynchronous state of the amplitude synchronous detector and for producing a control signal to the AGC voltage generating circuit in response to the detection of said asynchronous state, thereby preventing a malfunction of the AGC voltage generating circuit.

* * * * *